United States Patent [19]

Koliwad et al.

[11] 4,249,957

[45] Feb. 10, 1981

[54] COPPER DOPED POLYCRYSTALLINE SILICON SOLAR CELL

[76] Inventors: Alan M. Lovelace, Administrator of the National Aeronautics and Space Administration, with respect to an invention of Krishna M. Koliwad, La Canada; Taher Daud, La Crescenta, both of Calif.

[21] Appl. No.: 43,941

[22] Filed: May 30, 1979

[51] Int. Cl.³ .................................................. H01L 31/06
[52] U.S. Cl. ..................................... 136/258; 357/30; 357/59; 357/63; 252/62.3 E
[58] Field of Search ...................... 136/89 TF, 89 SG; 357/30, 59, 63; 252/62.3 E

[56] References Cited

PUBLICATIONS

T. Daud et al., "Effect of Copper Impurity on Polycrystalline Silicon Solar Cells", *Conf. Record, 13th IEEE Photovoltaic Specialists Conf.*, (1978), pp. 503–506.

G. F. Wakefield et al., "Influence of Impurities on Silicon Solar Cell Performance", Conf. Record, *11th IEEE Photovoltaic Specialists Conf.*, (1975), pp. 49–55.

A. Usami, "Copper-Doped Radiation Resistant n/p Type Silicon Solar Cells", *Solid–State Electronics*, vol. 13, pp. 1202–1204 (1970).

A. M. Salama, "Copper Precipitation Effects in Silicon Used in Solar Cells", *J. Electrochem. Soc.*, vol. 126, pp. 114–118 (1979).

T. L. Chu et al., "Polycrystalline Silicon Solar Cells on Metallurgical Silicon Substrates", *Solid–State Electronics*, vol. 19, pp. 837–841 (1976).

T. Warabisako et al., "Polycrystalline Solar Cells Fabricated on Metallurgical Silicon Substrates", *Proc. Int'l Photovoltaic Solar Energy Conf., Luxembourg*, Sep. 1977, Reidel Publishing Co., Aug. 1978, pp. 187–196.

J. I. Hanoka et al., "Efficient Polycrystalline Solar Cells Made From Low–Cost Refined Metallurgical Silicon", *Conf. Record, 13th IEEE Photovoltaic Specialists Conf.* (1978), pp. 485–489.

*Primary Examiner*—Aaron Weisstuch
*Attorney, Agent, or Firm*—Monte F. Mott; John R. Manning; Wilfred Grifka

[57] ABSTRACT

Photovoltaic cells having improved performance are fabricated from polycrystalline silicon containing copper segregated at the grain boundaries.

4 Claims, 5 Drawing Figures

COPPER DOPED POLYCRYSTALLINE SILICON SOLAR CELL

DESCRIPTION

ORIGIN OF THE INVENTION

The invention described herein was made in the performance of work under an Interagency agreement between the Department of Energy and the National Aeronautics and Space Administration in continuation of the work under NASA prime contract NAS7-100 between NASA and the California Institute of Technology, and is subject to the provisions of Section 305 of the National Aeronautics and Space Act of 1958, Public Law 83-568 (72 Stat. 435; 42 USC 2457).

TECHNICAL FIELD

The present invention relates to improved photovoltaic solar cells and, more particularly, to copper-doped, polycrystalline silicon cells.

BACKGROUND ART

Self sufficiency in energy is a stated national goal. Most of the proposed means to achieve this goal are either environmentally unacceptable or are not feasible, especially those not depending on fossil fuel sources. Of the available alternatives, solar energy is the most abundant, inexhaustable single resource available. However, capturing and utilizing solar energy is not simple. Methods are being sought to convert solar energy to a concentrated, storable form of energy. A known method, photosynthesis, converts somewhat less than 1% of the sun's energy at the earth's surface to a solid fuel, i.e., plant materials, which when accumulated and transformed over geologic ages yielded fossil fuels. Current rates of use of these fossil fuels, and the particular geographic distribution and political control of major petroleum resources pose problems for nations that are net petroleum consumers. An alternate method yielding a simpler fuel, at a higher conversion, has long been desired.

One method of converting solar energy to a usable form being prominently considered is the deployment of large arrays of photovoltaic solar cells, especially in the sunbelt areas such as the southwestern and western regions of the United States. The most promising candidate for the solar cell is a doped silicon sheet material and silicon is one of the most plentiful elements in the earth's crust. However, the economic feasibility depends on processing cost and presently the most efficient cells are produced from single crystalline silicon. Photovoltaic cells have recently been produced from lower cost polycrystalline silicon but the efficiency of these cells are not as high as those produced from single crystalline cells.

DISCLOSURE OF INVENTION

It has now been discoverd in accordance with the invention that the presence of copper in polycrystalline silicon solar cells strongly enhances the performance of the cells. It has further been discovered that the effect of copper in polycrystalline, silicon solar cells is contrary to that observed in single crystal silicon solar cells, that the effect is greater with smaller grain size and that copper diffused into coarse grained silicon degrades cell performance.

These and many other of the advantages and features of the invention will become readily apparent as the invention becomes better understood by reference to the following detailed description when considered in conjunction with the accompanying drawings.

BEST MODE FOR CARRYING OUT THE INVENTION

Figure 1:
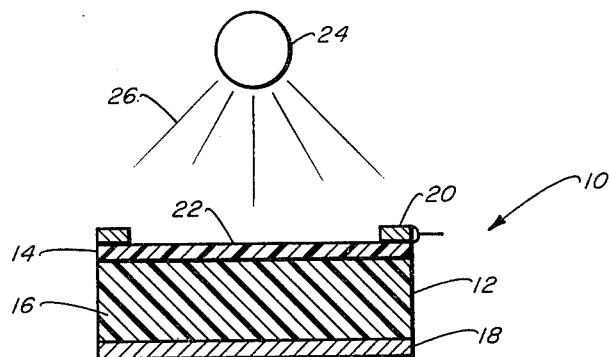
FIG. 1 is a schematic view of a photovoltaic cell in accordance with this invention.
Figure 2:
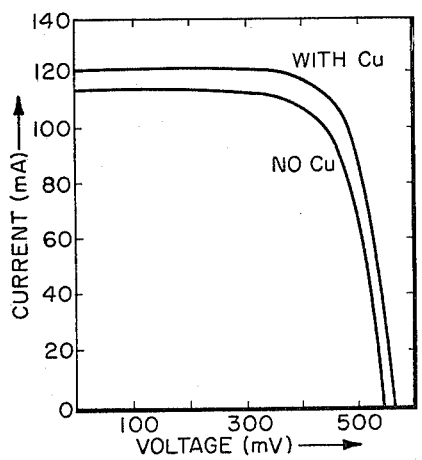
FIG. 2 is a pair of graphs illustrating the light I-V characteristics (AMO illumination) of fine grain, polycrystalline, silicon solar cells.
Figure 4:
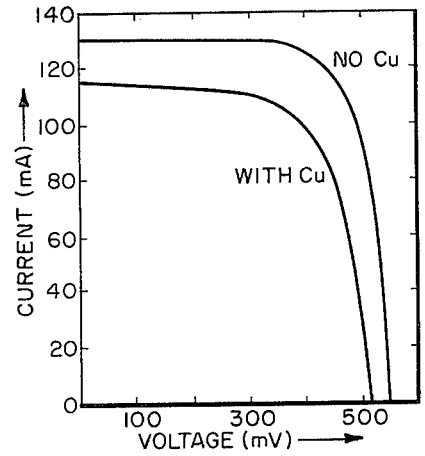
FIG. 4 is a pair of graphs illustrating the light I-V characteristics (AMO illumination) of coarse grain, polycrystalline silicon solar cells.
Figure 3:
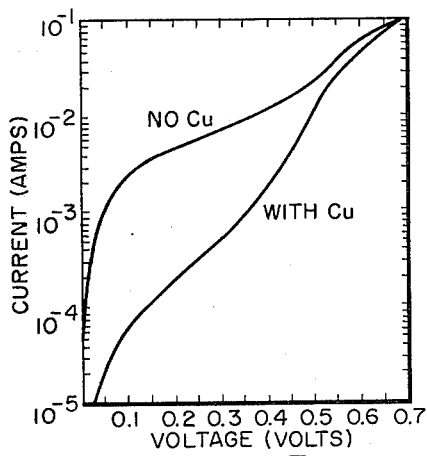
FIG. 3 is a pair of graphs illustrating the dark forward I-V characteristics of fine grain, polycrystalline, silicon solar cells.
Figure 5:
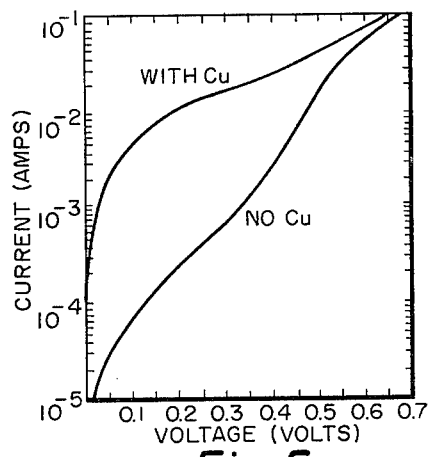
FIG. 5 is a pair of graphs illustrating the dark forward I-V characteristics of coarse grain, polycrystalline silicon solar cells.

Referring now to FIG. 1, a photovoltaic solar cell 10 in accordance with this invention includes a polycrystalline silicon body or blank 12 having a first layer 16 of one conductivity and a second layer 14 of opposed conductivity forming junction diode. A first electrode 18 is provided across the rear surface of the cell and a second electrode 20 is deposited on the front surface 22 of the cell facing the sun 24. The front surface may also be provided with antireflective and/or encapsulating coatings, not shown. When solar radiation 26 is absorbed by the cell 10, electron hole pairs are generated within the cell inducing a voltage between the electrodes 18, 20.

The silicon blank may be circular or rectangular and can be produced from cast or grown ingots. The silicon blank is processed to contain from $10^{14}$ to $10^{15}$ atoms/cc of copper in accordance with this invention, preferentially segregated at the grain boundaries. The copper is introduced into the blank by thermally diffusing copper into cast ingots or by copper doping the silicon melt from which ingots are grown. The grain size is from 100 Å to 5 mm, preferably from 0.05 to 0.5 mm.

The polycrystalline silicon is rendered P-type by adding elements such as boron or aluminum to the melt or casting bath. The N-layer is formed by thermally diffusing a dopant such as phosphorus or arsenic into the top layer of the cell. Contact electrodes are usually fabricated by evaporating metal onto the surface of the cell.

EXAMPLE 1

Copper-containing, boron-doped, P-type polycrystalline silicon wafers having a nominally 1-6 Ω-cm resistivity were grown by the Czochralski process to give $\sim 10^{15}$ atoms of copper per cc. The ingots were cut into 10-15 mils thick, 2 cm×2 cm blanks. They were then chem-mechanically polished and cleaned.

EXAMPLE 2

P-type, boron-doped, nominally 1-6 Ω-cm resistivity polycrystalline silicon wafers (Wacker Chemitronic) were cut into 2 cm×2 cm blanks, and chemi-mechanically polished and cleaned. The blanks were then coated with a layer of copper from an electroless plating bath, placed in an evacuated quartz capsule and diffusion was performed at 450° C. for 15 minutes. The concentration of diffused copper is estimated to be about $10^{14}$ atoms/cc.

EXAMPLE 3

The copper-doped Czochralski grown polycrystalline silicone blanks of Example 1 and the copper-diffused, cast, polycrystalline silicon blanks of Example 2 were then processed into solar cells using standard baseline solar cell processing. Phosphorus was diffused into the blanks to nominally 0.35 μm using a $POCl_3$ source. The contact electrode metallization system consisted of titanium-palladuim-silver. SiO was used for the anti-reflection coating.

Solar cell testing consisted of the measurement of light and dark I-V parameters and spectral response in the blue and red regions of the spectrum. The light I-V measurement was performed at AMO illumination at 25° C. The maximum power, $P_m$, and the curve fill factor FF, were computed from the light I-V plots. Table I lists the light I-V data of polycrystalline solar cells with and without copper impurity. Set A in the table refers to solar cells fabricated using polycrystalline wafers diffused with copper. The data are arranged in increasing order of grain-size ranging from fine (0.1 mm) to coarse (1.0 mm). Set B in the table similarly refers to cells fabricated using polycrystalline wafers obtained from copper-doped silicon ingots. The data in each group is an average of measurements on several cells of equivalent grain-size.

TABLE 1

Light I-V Data (AMO Illumination)

| Grains | Group | | $V_{oc}$ (mV) | $I_{sc}$ (mA) | FF | $P_m$ (mW) | $\Delta P_m,\%$ |
|---|---|---|---|---|---|---|---|
| | | Set A: Diffused Copper | | | | | |
| Fine | 1 | No Cu | 514 | 109.7 | 0.68 | 38.3 | +14.9 |
| ↑ | | With Cu | 535 | 111.7 | 0.74 | 44.0 | |
| ↑ | 2 | No Cu | 521 | 112.2 | 0.68 | 40.1 | +12.2 |
| ↑ | | With Cu | 538 | 112.6 | 0.74 | 45.0 | |
| ↑ | 3 | No Cu | 537 | 116.8 | 0.67 | 41.8 | +6.9 |
| ↑ | | With Cu | 547 | 116.2 | 0.70 | 44.7 | |
| ↑ | 4 | No Cu | 523 | 110.2 | 0.71 | 40.6 | +2.7 |
| ↑ | | With Cu | 528 | 111.1 | 0.71 | 41.7 | |
| ↓ | 5 | No Cu | 521 | 115.4 | 0.70 | 41.9 | −1.2 |
| ↓ | | With Cu | 536 | 112.7 | 0.68 | 41.4 | |
| ↓ | 6 | No Cu | 527 | 117.3 | 0.70 | 43.1 | −5.3 |
| ↓ | | With Cu | 525 | 113.9 | 0.68 | 40.8 | |
| ↓ | 7 | No Cu | 536 | 115.5 | 0.75 | 46.1 | −13.9 |
| ↓ | | With Cu | 529 | 112.9 | 0.66 | 39.7 | |
| ↓ | 8 | No Cu | 544 | 120.0 | 0.74 | 48.0 | −18.1 |
| Coarse | | With Cu | 526 | 114.4 | 0.65 | 39.3 | |
| | | Set B: Doped With Copper | | | | | |
| | | No Cu | 533 | 106.0 | 0.69 | 39.1 | +16.4 |
| | | With Cu | 552 | 112.4 | 0.73 | 45.5 | |

*$V_{oc}$ - Open Cell Voltage
**$I_{sc}$ - Short Circuit Current

As one can expect, the data shows that the performance of solar cells not containing copper improves with increasing grain-size. It is worth noting that the effect of copper in polycrystalline silicon solar cells is contrary to that observed in single crystal solar cells.

The presence of diffused copper in fine grained silicon considerably improves all the cell parameters. The improvement decreases with increasing grain-size and in the range of coarse grain-size, copper deteriorates the performance of solar cells. However, in the case of copper-doped polycrystalline Czochralski grown wafers, the effect is positive even for large grain size. This effect of copper is shown in the last column in Table 1 as percentage change in maximum power ($\Delta P_m\%$). FIGS. 2-5 show typical light and dark I-V characteristics of solar cells with and without copper for fine and coarse grain silicon.

It is believed that the results can be explained on the basis of the segregation of copper to the grain-boundary. When copper is diffused in polycrystalline silicon, the probability of it being segregated increases with increasing density of boundaries (i.e., decreasing grain-size). The segregation of copper to the grain-boundary results in pinning the dangling bonds thereby reducing the minority carrier recombinations. Hence, the presence of copper in the case of solar cells fabricated using fine grained silicon sheet enhances their performance. In the case of solar cells fabricated using fine grained silicon sheet enhances their performance. In the case of large grain-size structures, there is evidence of precipitation in the intra-grain region. It is interesting to note from the Set B data that the presence of copper enhances the performance of solar cell fabricated using wafers from doped ingots in spite of large grain-size. This again can be explained by the fact that the segregation of copper to the boundary occurs during growth.

Thus, copper shows a contrary effect to that observed in single crystalline silicon solar cells. The presence of copper in fine grain, polycrystalline silicon solar cells strongly enhances the performance of the cells and diffusing copper into coarse grained, polycrystalline, cast silicon degrades the cell performance. The critical grain-size beyond which copper is detrimental appears to be concentration dependent.

It is to be realized that only preferred embodiments of the invention have been described and that numerous substitutions, alterations and modifications may be made without departing from the spirit and scope of the invention as defined in the following claims.

We claim:

1. A photovoltaic solar cell comprising: a polycrystalline silicon body having a grain size from 100° A to 0.05 mm doped with an element providing a first conductivity type and also containing $10^{14}$ to $10^{15}$ atoms per cc of copper segregated at the grain boundaries and further comprising a surface layer of opposite conductivity type and electrode means directly connected to each of said conductivity portions of the body.

2. A cell according to claim 1 in which the element providing said first conductivity type is boron and the opposite conductivity type surface layer includes phosphorus.

3. A cell according to claim 1 in which the grain size is from 0.05 to 0.5 mm.

4. A cell according to claim 3 in which the element providing said first conductivity type is boron and the element providing said second conductivity type is phosphorus.

* * * * *